(12) United States Patent
Prejbeanu

(10) Patent No.: US 8,659,938 B2
(45) Date of Patent: Feb. 25, 2014

(54) MULTIBIT MAGNETIC RANDOM ACCESS MEMORY CELL WITH IMPROVED READ MARGIN

(75) Inventor: Ioan Lucian Prejbeanu, Seyssinet Pariset (FR)

(73) Assignee: Crocus Technology SA, Grenoble Cedex (FR)

( * ) Notice: Subject to any disclaimer, the term of this patent is extended or adjusted under 35 U.S.C. 154(b) by 132 days.

(21) Appl. No.: 13/326,439

(22) Filed: Dec. 15, 2011

(65) Prior Publication Data

US 2012/0155159 A1   Jun. 21, 2012

(30) Foreign Application Priority Data

Dec. 16, 1920   (EP) .................................... 10290662

(51) Int. Cl.
*G11C 11/00* (2006.01)
(52) U.S. Cl.
USPC ................. 365/158; 365/46; 365/55; 365/74; 365/97; 365/100; 365/131; 365/148; 365/171; 365/173; 365/163
(58) Field of Classification Search
USPC ......... 365/46, 55, 74, 97, 100, 131, 148, 158, 365/171, 173, 163
See application file for complete search history.

(56) References Cited

U.S. PATENT DOCUMENTS

| 5,640,343 | A | 6/1997 | Gallagher et al. |
| 2005/0002228 | A1 | 1/2005 | Dieny et al. |
| 2010/0103728 | A1* | 4/2010 | Zhu et al. ....................... 365/171 |
| 2010/0284215 | A1* | 11/2010 | Prejbeanu et al. ............ 365/171 |
| 2011/0140762 | A1* | 6/2011 | Jiang et al. ..................... 327/365 |
| 2012/0120710 | A1* | 5/2012 | Rabkin et al. .................. 365/148 |

* cited by examiner

*Primary Examiner* — Fernando Hidalgo
(74) *Attorney, Agent, or Firm* — Pearne & Gordon LLP

(57) ABSTRACT

A magnetic random access memory (MRAM) cell including a magnetic tunnel junction including a tunnel barrier layer between a first magnetic layer having a first magnetization direction, and a second magnetic layer having a second adjustable magnetization to vary a junction resistance of the magnetic tunnel junction from a first to a second junction resistance level; said magnetic tunnel junction further including a switching resistant element electrically connected to the magnetic tunnel junction and having a switching resistance switchable from a first to a second switching resistance level when a switching current is passed through the switching resistant element, such that a resistance of the MRAM cell can have at least four different cell resistance levels depending of the resistance level of the junction resistance and the switching resistance. The disclosed MRAM cell achieves improved read margin and allows for writing at least four different cell resistance levels.

15 Claims, 5 Drawing Sheets

MULTIBIT MAGNETIC RANDOM ACCESS MEMORY CELL WITH IMPROVED READ MARGIN

FIELD OF THE INVENTION

The present disclosure relates to a tunnel magnetic junction-based magnetic random access memory (MRAM) cell with improved read margin and that can be used as a multibit MRAM cell. The present disclosure also relates to a method of writing multiple data bits in the MRAM cell.

DESCRIPTION OF RELATED ART

Memory devices that employ variable resistance materials include resistive random access memories (RRAM), phase change random access memories (PRAM), ferroelectric random access memories (FRAM), magnetic random access memories (MRAM), etc. The nonvolatile memory devices listed above may store data based on a variation in the resistance of a variable resistance material (RRAM), a phase change material having amorphous and crystalline states (PRAM), a ferroelectric material having different polarization states (FRAM), and/or a magnetic tunnel junction film of a ferroelectric material having different magnetized states (MRAM).

Devices based on MRAM have experiencing a renewed interest since magnetic tunnel junctions can have a strong magnetoresistance at ambient temperature. MRAM present many advantages such as high writing and reading speeds (down to a few nanoseconds of), non volatility, and insensitivity to ionizing radiations. MRAM comprising a so-called "magnetoresistance effect" or GMR have been first proposed. Such MRAMs were made by stacking several metal layers being alternatively magnetic and nonmagnetic. The GMR element exhibits a relatively large magnetoresistive change ratio, but disadvantageously requires large magnetic fields to be applied and thus requires large currents for writing and reading information.

The development of MRAM cells with a magnetic tunnel junction has allowed for a significant increase in the performances and operating mode of these MRAMs. Such MRAM cells are described in U.S. Pat. No. 5,640,343. FIG. 1 shows a conventional MRAM cell 1 comprising a magnetic tunnel junction 2 comprising a tunneling barrier layer 22 between a first ferromagnetic layer 21 and a second ferromagnetic layer 23. The magnetic tunnel junction 2 is electrically connected at one end to a first current line 4 and, to its other end, to a selection CMOS transistor 3. The MRAM cell 1 shown in FIG. 1 further comprised a second current line 5 is disposed orthogonal to the first current line 4. This configuration includes a strap 7 between the magnetic tunnel junction 2 and the selection transistor 3 such that the second current line 5 can be disposed aligned with the magnetic tunnel junction 2.

The first and second ferromagnetic layers 21, 23 typically have different coercivity and are preferentially made from 3 d metals such as Fe, Co, Ni, and their alloys, possibly containing boron in order to amorphize the ferromagnetic layers and to flatten their interfaces. The tunneling barrier layer 22 is typically a thin insulating layer of alumina ($Al_2O_3$) or MgO. Each ferromagnetic layer 21, 23 can be coupled with an anti-ferromagnetic layer (not shown), whose function is to trap the ferromagnetic layer it couples, so that the magnetization of the coupled ferromagnetic layer 21, 22 is pinned and cannot rotate freely, but only in a reversible way, under the effect of an external magnetic field.

During a write operation of the conventional MRAM cell 1, the selection transistor 3 is set in a blocked mode such that no current passes through the magnetic tunnel junction 2. A first field current 41 is passed in the first current line 4 generating a first magnetic field 42, and a second field current 51 is passed in the second current line 5 generating a second magnetic field 52. The first and second magnetic fields 42, 52 are adapted such as to switch the magnetization direction of the second magnetic layer 23, thus writing the MRAM cell 1. In an array comprising a plurality of the MRAM cell 1, only the cell 1 being located at the intersection of the first and second current line 4, 5 is being written, or addressed, under the effect of the combined first and second magnetic fields 42, 52. The write operation is then selective.

FIG. 2 illustrates the MRAM cell 1 in another configuration, wherein the cell 1 does not comprise the second current 5. In this configuration, the write operation can comprise passing a spin polarized write current 31 through the magnetic tunnel junction 2 when the selection transistor 3 is in the saturated mode. The spin polarized write current 31 is spin polarized such as to induce a local spin torque on the second magnetic layer 23.

During a read operation, a read current 32 is selectively passed through the magnetic tunnel junction 2 of the written cell 1 by setting the selection transistor 3 of this cell 1 in the saturated mode such as to measure a junction resistance ($R_{MTJ}$) of the magnetic tunnel junction 2. The magnetoresistance of the MRAM cell 1 can be determined by comparing the measured junction resistance ($R_{MTJ}$) with a reference resistance measured for a reference MRAM cell (not represented). A low measured junction resistance $R_{MTJ}$ (or level state "0") corresponds to the magnetization direction of the second ferromagnetic layer 23 being oriented parallel to the magnetization direction of the first ferromagnetic layer 21, while a high measured junction resistance $R_{MTJ}$ (or level state "1") corresponds to the magnetization direction of the second ferromagnetic layer 23 being oriented antiparallel to the magnetization direction of the first ferromagnetic layer 21. The difference between the value of the high and low junction resistance ($R_{MTJ}$), or the tunnel magnetoresistance, depends on the material composing the ferromagnetic layers and possibly on heat treatment performed on these ferromagnetic layers. A tunnel magnetoresistance of up to 70% can be reached with a suitable choice of materials and/or heat treatment.

MRAM cells with a multilevel state write operation has also been proposed, allowing for writing more than the two level states "0" and "1" as described above. Such a MRAM cell with a multilevel state write operation is disclosed in U.S. Pat. No. 6,950,335. Here, the magnetization of the second ferromagnetic layer, or storage layer, can be oriented in any intermediate direction between the direction parallel and the direction antiparallel to the magnetization direction of the first ferromagnetic layer, or reference layer. Orienting the magnetization of the storage layer in the intermediate directions can be achieved by generating magnetic fields with appropriate relative intensity along the perpendicular directions of the first and second current line 4, 5, or by combining the magnetic field generated in one of the line 4, 5 with the spin polarized write current (for example, in the case of the MRAM cell configuration of FIG. 1).

One shortcoming of the previous proposed MRAM cells with multilevel state write operation, however, is that the resistance level corresponding to each state can be relatively small.

Recently, MRAM cells with increased of the read margin have been obtained by using tunneling barrier layers made of MgO providing high tunnel magnetoresistance. This increase in tunnel magnetoresistance has been attributed to the crystalline structure of the MgO barrier which can be monocrystalline or highly textured with a bcc (001) crystal orientation. More particularly, magnetoresistance above about 150% at room temperature have been obtained for magnetic tunnel junctions comprising epitaxial MgO tunneling barrier layers with bcc Fe or Co electrodes, or comprising textured tunneling barrier layers including polycrystalline bcc CoFe or Co electrodes, or comprising CoFeB/MgO/CoFeB structures, with amorphous CoFeB electrodes. In the latter case, the MgO tunneling barrier layer is grown with a highly oriented bcc (001) texture on top of an amorphous CoFeB layer. After deposition, a thermal annealing is required in order to induce an identical texture in the CoFeB electrodes, in order to achieve a high magnetoresistance.

BRIEF SUMMARY OF THE INVENTION

In the present disclosure, a magnetic random access memory (MRAM) cell can comprise: a magnetic tunnel junction comprising a tunnel barrier layer between a first magnetic layer having a first magnetization direction, and a second magnetic layer having a second magnetization direction being adjustable from a first direction to a second direction relative to the first magnetization direction, such as to vary a junction resistance of the magnetic tunnel junction from a first to a second junction resistance level; characterized in that said magnetic tunnel junction further comprises a switching resistant element electrically connected to the magnetic tunnel junction and having a switching resistance that can be switched from a first to a second switching resistance level when a switching current is passed through the switching resistant element, such that a MRAM cell resistance of the MRAM cell can have at least four different cell resistance levels depending of the resistance level of the junction resistance and the switching resistance.

In an embodiment, the MRAM cell can further comprise a first current line electrically connected to one end of the magnetic tunnel junction, and a selection transistor electrically connected to the other end of the magnetic tunnel junction; the selection transistor being selectable to pass the switching current in the current line to the magnetic tunnel junction and the switching resistant element.

The switching resistant element can be in contact with the first or second magnetic layer, or the tunnel barrier layer can consist of the switching resistant element.

In an embodiment, the switching resistant element can be made of a material selected from $Al_2O_3$, NiO, $TiO_2$, MgO, or a perovskite-type oxide.

The disclosure also pertains to a method for writing multiple data bits in the MRAM cell, comprising:

heating the magnetic tunnel junction to a high temperature threshold by passing the switching current in the magnetic tunnel junction, the switching current having a heating magnitude suitable for heating the magnetic tunnel junction at a high temperature threshold;

adjusting the second magnetization direction of the second magnetic layer to vary the junction resistance from the first junction resistance level to the second junction resistance level; and switching the switching resistance from the first switching resistance level to the second switching resistance level by passing the switching current through the switching resistant element.

Said switching the switching resistance can comprise changing the polarity of the switching current, or can comprise passing the switching current having a first switching magnitude that is lower than the heating magnitude.

In an embodiment, said switching the switching resistance can comprise changing the magnitude of the switching current from a first switching magnitude to a second switching magnitude.

In another embodiment, said adjusting the second magnetization direction of the second magnetic layer can comprise applying a first magnetic field, the second magnetization direction of the second magnetic layer being adjusted according to the first magnetic field.

In yet another embodiment, said adjusting the second magnetization direction of the second magnetic layer can comprise passing the switching current in the magnetic tunnel junction, the switching current being spin polarized.

The MRAM cell disclosed herein achieves improved read margin compared to conventional MRAM cells by combining the junction resistance of the magnetic tunnel junction and the switching resistance of the switching resistant element.

Moreover, the MRAM cell 1 also allows to be used as a multibit MRAM cell, for writing at least four different cell resistance levels. The cell resistance levels of the multibit MRAM cell are larger than the ones achieved in conventional multibit MRAM cells.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 3:
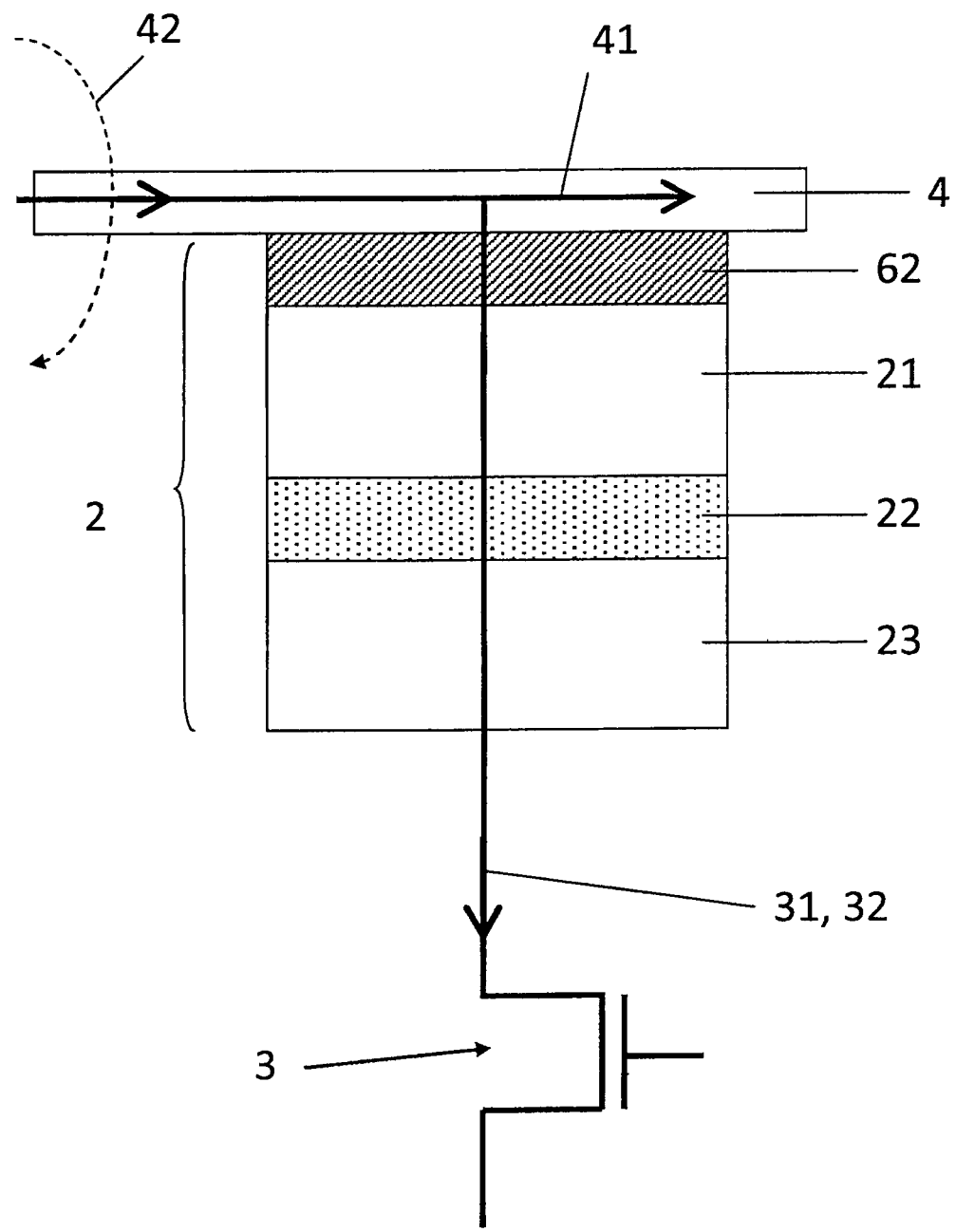
FIG. 3 represents a MRAM cell according to an embodiment.
Figure 4:
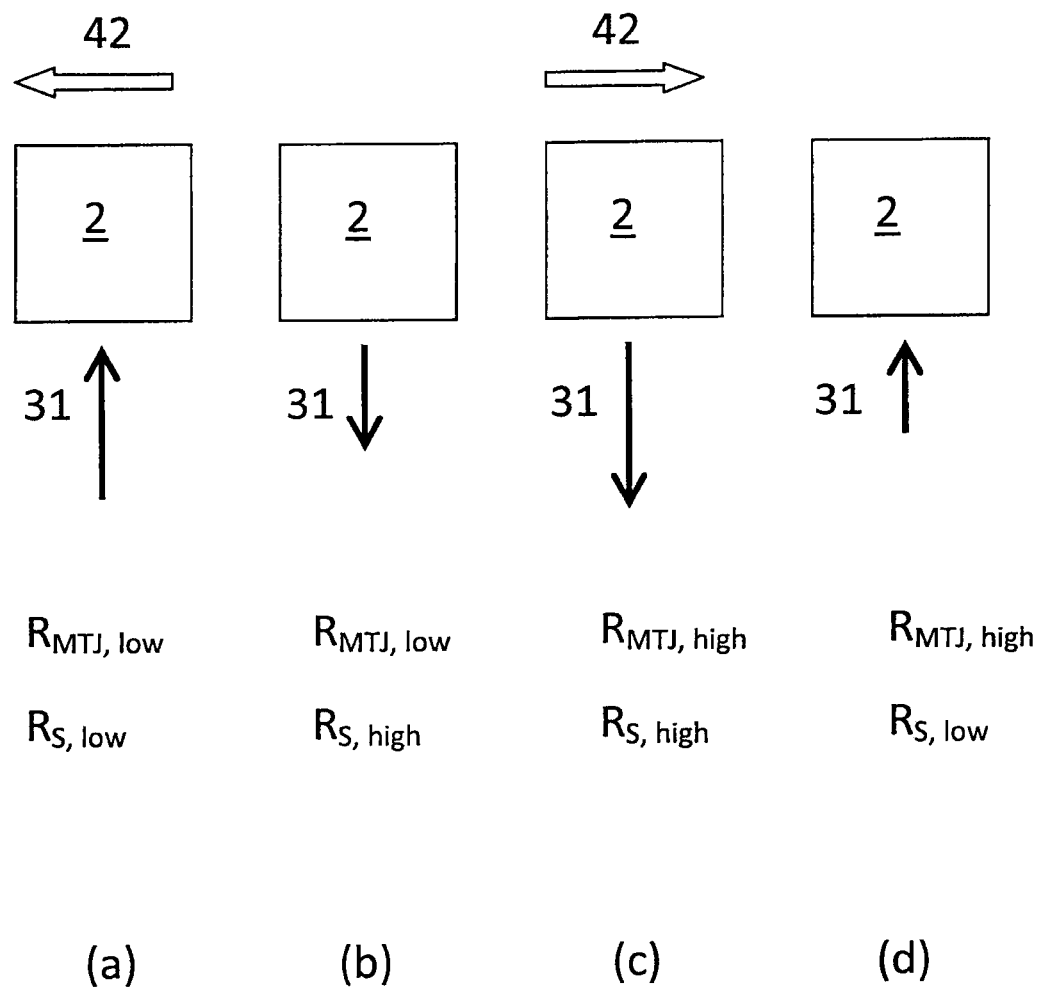
FIG. 4 represents a write operation of the MRAM cell of FIG. 3 according to an embodiment.

A magnetic random access memory (MRAM) cell 1 according to an embodiment is represented in FIG. 3. The MRAM cell comprises a magnetic tunnel junction 2 comprising a tunnel barrier layer 22 disposed between a first magnetic layer 21 having a first magnetization direction, and a second magnetic layer 23 having a second magnetization direction. The second magnetization direction is adjustable from a first to a second direction relative to the first magnetization direction such as to vary a junction resistance $R_{MTJ}$ of the magnetic tunnel junction 2 from a first to a second junction resistance level. In the example of FIG. 4, the memory element further comprises a first current line 4 electrically connected to one end of the magnetic tunnel junction 2, and a selection transistor 3 electrically connected to the other end of the magnetic tunnel junction 2.

The second ferromagnetic layer, or storage layer 23, can be made of a material having a planar magnetization, typically selected from the group Permalloy (Ni80Fe20), Co90Fe10 or other alloys containing Fe, Co or Ni. In a preferred embodiment, the second ferromagnetic layer 23 is exchange-coupled by an antiferromagnetic storage layer (not represented) such that a magnetization direction of the second ferromagnetic layer 23 is pinned by the antiferromagnetic storage layer at a low temperature threshold, and such that the magnetization direction of the second ferromagnetic layer 23 can be freely oriented at a high temperature threshold. The antiferromagnetic storage layer can be made of a manganese-based alloy, such as IrMn or FeMn, or any other suitable materials. The high temperature threshold is typically at or above a temperature of about 120° C.

The first magnetic layer 21 is a ferromagnetic layer that can be made from a Fe, Co or Ni based alloy. Preferably, the first magnetic layer 21 comprises a synthetic antiferromagnet pinned layer comprising a first ferromagnetic reference layer and a second ferromagnetic reference layer, both formed of a Fe, Co or Ni based alloy, and antiferromagnetically coupled by inserting between them a non-ferromagnetic reference layer made, for example, of ruthenium. In a preferred embodiment, the first magnetic layer, or reference layer 21, is antiferromagnetically coupled by an antiferromagnetic reference layer pinning its magnetization direction at temperature above the high temperature threshold. Preferably, the antiferromagnetic reference layer is formed of a Mn based alloy such as PtMn or NiMn. The tunneling barrier layer 22 is typically a thin insulating layer of alumina ($Al_2O_3$) or MgO.

In an embodiment, the magnetic tunnel junction 2 further comprises a switching resistant element 62. In the example of FIG. 4, the switching resistant element is represented as a switching resistant layer 62 located in contact with the first ferromagnetic layer 21 on its face opposed to the one in contact with the tunneling barrier layer 22. The switching resistant element 62 has a switching resistance $R_S$ that can be switched reversibly from a first to a second switching resistance level when a switching current 31 is passed through the switching resistant element 62 (or when a voltage is applied through the switching resistant element 62). Such switching resistant element is often used in resistive random access memories (RRAMs) where the transition metal oxide switching resistant element is typically comprised between two metallic electrodes. A MRAM cell resistance $R_C$ of the MRAM cell 1 then corresponds to the junction resistance $R_{MTJ}$ and the switching resistance $R_S$ in series.

The switching resistant element 62 can be made of an oxide comprising alumina ($Al_2O_3$), NiO, $TiO_2$, or MgO, preferably with an inhomogeneous oxygen content, or a perovskite-type oxide such as PCMO ($Pr_{0.7}Ca_{0.3}MnO_3$) or $SrTiO_3$, or a combination of any of these oxides. Depending on the oxide used and on its fabrication method, the switching resistant element 62 can exhibit a bipolar or unipolar switching resistance switching behavior. In the case the switching resistant element 62 has a bipolar resistance switching behavior, the switching resistance $R_S$ is switched with changing a polarity of the switching current 31 passing through the switching resistant element 62 (or of the voltage applied through the switching resistant element 62) from a first to a second switching polarity. Alternatively, in the case the switching resistant element 62 has a unipolar resistance switching behavior, the switching resistance $R_S$ is switched with changing a magnitude of the switching current 31 passing through the switching resistant element 62 (or of the voltage applied through the switching resistant element 62) from a first to a second switching magnitude.

An advantage of the unipolar resistance switching is that there is no need for additional transistor dedicated to switching the current/voltage polarity and thus, MRAM cell 1 can be made smaller. The unipolar resistance switching behavior can typically be obtained when the switching resistant element 62 is made of a metal transition oxide, while the bipolar resistance switching behavior can be achieved when the switching resistant element 62 is made of a perovskite-type oxide or an oxide having a non homogeneous stoichiometry in oxygen.

Other configurations of the switching resistant layer 62 are also possible. For example, the switching resistant layer 62 can be disposed in contact with the first or second ferromagnetic layer 21, 23 and possibly in contact with the tunneling barrier layer 22. Alternatively, the switching resistant layer 62 can be comprised within the tunneling barrier layer 22. In a preferred embodiment, the tunneling barrier layer 22 consists of the switching resistant element 62. In the latter configuration, the magnetic tunnel junction 2 comprises the switching resistant layer 62 disposed between the first and second magnetic layers 21, 23 or, in other words, the tunneling barrier layer 22 is made of an oxide comprising alumina, NiO, $TiO_2$, or MgO, preferably with an inhomogeneous oxygen content, or a perovskite-type oxide such as PCMO ($Pr_{0.7}Ca_{0.3}MnO_3$) or $SrTiO_3$, or a combination of any of these oxides.

In an embodiment, during a write operation of the MRAM cell 1, a first field current 41 is passed in the first current line 4, as described above. The first field current 41 generates a first magnetic field 42 that is applied on the second magnetic layer 23 such as to adjust its magnetization direction relative to the first magnetization direction, in accordance with the first magnetic field 42. A junction resistance $R_{MTJ}$ of the magnetic tunnel junction 2 can then be varied from a first junction resistance level to a second junction resistance level. The selection transistor 3 can be set in a blocked mode such that no current passes through the magnetic tunnel junction 2.

In a preferred embodiment, the write operation is performed according to a thermally assisted method. More particularly, the thermally assisted write operation comprises the steps of:

heating the magnetic tunnel junction 2;

simultaneously (or after a short time delay) and once the magnetic tunnel junction 2 has reached a high temperature threshold, adjusting the magnetization direction of the second ferromagnetic layer 23; and cooling the magnetic tunnel junction 2 at a low temperature threshold, wherein the magnetization direction of the second ferromagnetic layer 23 is frozen in the written state.

Adjusting the magnetization direction of the second ferromagnetic layer 23 can be performed by passing the first field current 41 in the first current line 4 such as to generate the first magnetic field 42 adapted to adjust the magnetization direction of the second ferromagnetic layer 23. The first magnetic field 42 can be maintained during the cooling of the magnetic tunnel junction 2 and removed once the magnetic tunnel junction 2 has reached the low temperature threshold.

Heating the magnetic tunnel junction 2 can be performed by passing a heating current in the first current line 4 to the magnetic tunnel junction 2 when the selection transistor 3 is set in a saturated mode. Cooling the magnetic tunnel junction 2 is then performed by turning off the heating current by setting the selection transistor 3 in a blocked mode.

The thermally assisted write operation is typically performed on the MRAM cell 1 wherein the magnetic tunnel junction 2 further comprises an antiferromagnetic storage layer (not shown) exchange-coupling the second ferromagnetic layer 23. In this configuration, the antiferromagnetic storage layer pins the magnetization of the second ferromagnetic layer 23 at the low temperature threshold, and frees the magnetization of the second ferromagnetic layer 23 at the high temperature threshold. Such thermally assisted write operation is described in U.S. Pat. No. 6,950,335. The thermally assisted write operation allows for reducing the first magnetic field 42 used to align the magnetization direction of the second ferromagnetic layer 23 and thus, to reduce power consumption of the MRAM cell.

In a preferred embodiment, the write operation further comprises a step of reversibly switching the switching resistance $R_S$ of the switching resistant element 62 from a first to a second switching resistance level. This can be performed by passing the switching current 31 through the magnetic tunnel junction 2 and the switching resistant element 62, when the selection transistor 3 is in the saturated mode.

During a read operation, a read current 32 is selectively passed through the magnetic tunnel junction 2 of the written cell 1 by setting the selection transistor 3 of this cell 1 in the saturated mode such as to measure the MRAM cell resistance $R_C$ of the MRAM cell 1. The MRAM cell resistance $R_C$ corresponds to the junction resistance $R_{MTJ}$, determined by the magnetization direction of the second ferromagnetic layer 23 relative to the magnetization direction of the first ferromagnetic layer 21, in series with the switching resistance $R_S$.

EXAMPLE 1

A write operation of the MRAM cell 1 is represented schematically in FIG. 4 according to an embodiment. The thermally assisted write operation comprises heating the magnetic tunnel junction 2 and varying the junction resistance $R_{MTJ}$ by passing the first field current 41 in the first current line 4 such as to generate the first magnetic field 42. The switching resistance $R_S$ is switched according to the polarity of the switching current 31 passing in the magnetic tunnel junction 2, for instance, in the case of the switching resistant element 62 having a bipolar resistance switching behavior. Here, the switching current 31 can also be used as the heating current. In the present embodiment, it is assumed that the switching resistance $R_S$ can be switched when the switching current 31 is passed with a first switching magnitude that is lower than a heating magnitude of the switching current 31, required for heating the magnetic tunnel junction at the high temperature threshold.

More particularly, FIG. 4 (a) shows a first step of the write operation where the switching current 31 is applied with the heating magnitude suitable for heating the magnetic tunnel junction 2 at the high temperature threshold. The first field current 41 is applied with a first polarity such as to generate the first magnetic field 42 with a first direction and vary the junction resistance $R_{MTJ}$ from the first to the second junction resistance level. For example, the magnetization of the second ferromagnetic layer 23 can be adjusted in a direction parallel to the magnetization direction of the first ferromagnetic layer 21, thus corresponding to a low junction resistance level $R_{MTJ, low}$ of the junction resistance $R_{MTJ}$. Since the switching current 31 is applied with the heating magnitude, above the first magnitude, the switching resistance $R_S$ will be switched to the first switching resistance level according to the polarity of the switching current 31, for example, to a low switching resistance level $R_{S, low}$.

In a second step shown in FIG. 4 (b), the first magnetic field 42 is not applied and the junction resistance $R_{MTJ}$ remains at its low junction resistance level $R_{MTJ, low}$. The switching current 31 is passed in the magnetic tunnel junction 2 with its polarity being reversed compared the one in step (a), such as to switch the switching resistance $R_S$ to a high switching resistance level $R_{S, high}$. Here, the switching current 31 is preferably passed with the lower first switching magnitude as shown in (b).

In a third step shown in FIG. 4 (c), the first field current 41 is applied with a second polarity such as to generate the first magnetic field 42 with a second direction, opposed to the first, such as to adjust the magnetization of the second ferromagnetic layer 23 in a direction antiparallel to the magnetization direction of the first ferromagnetic layer 21. This results in a high junction resistance level $R_{MTJ, high}$ of the junction resistance $R_{MTJ}$. The switching current 31 is passed magnetic tunnel junction 2 with the same polarity as in step (b), but with the first magnitude such as to heat the magnetic tunnel junction at the high temperature threshold. The polarity of the switching current 31 being the same as in step (b), the switching resistance $R_S$ remains unchanged to its high switching resistance level $R_{S, high}$.

In a fourth step shown in FIG. 4 (d), the first magnetic field 42 is not applied and the junction resistance $R_{MTJ}$ remains at the high junction resistance level $R_{MTJ, high}$ of step (c). The switching current 31 is passed at the first switching magnitude with its polarity being reversed compared the one in step (c), such that the switching resistance $R_S$ is switched to the low switching resistance level Consequently, four different cell resistance levels of the MRAM cell resistance $R_C$ have been written in the MRAM cell 1 by the combination of the two resistance levels of the junction resistance $R_{MTJ}$ and the switching resistance $R_S$.

EXAMPLE 2

Figure 5:
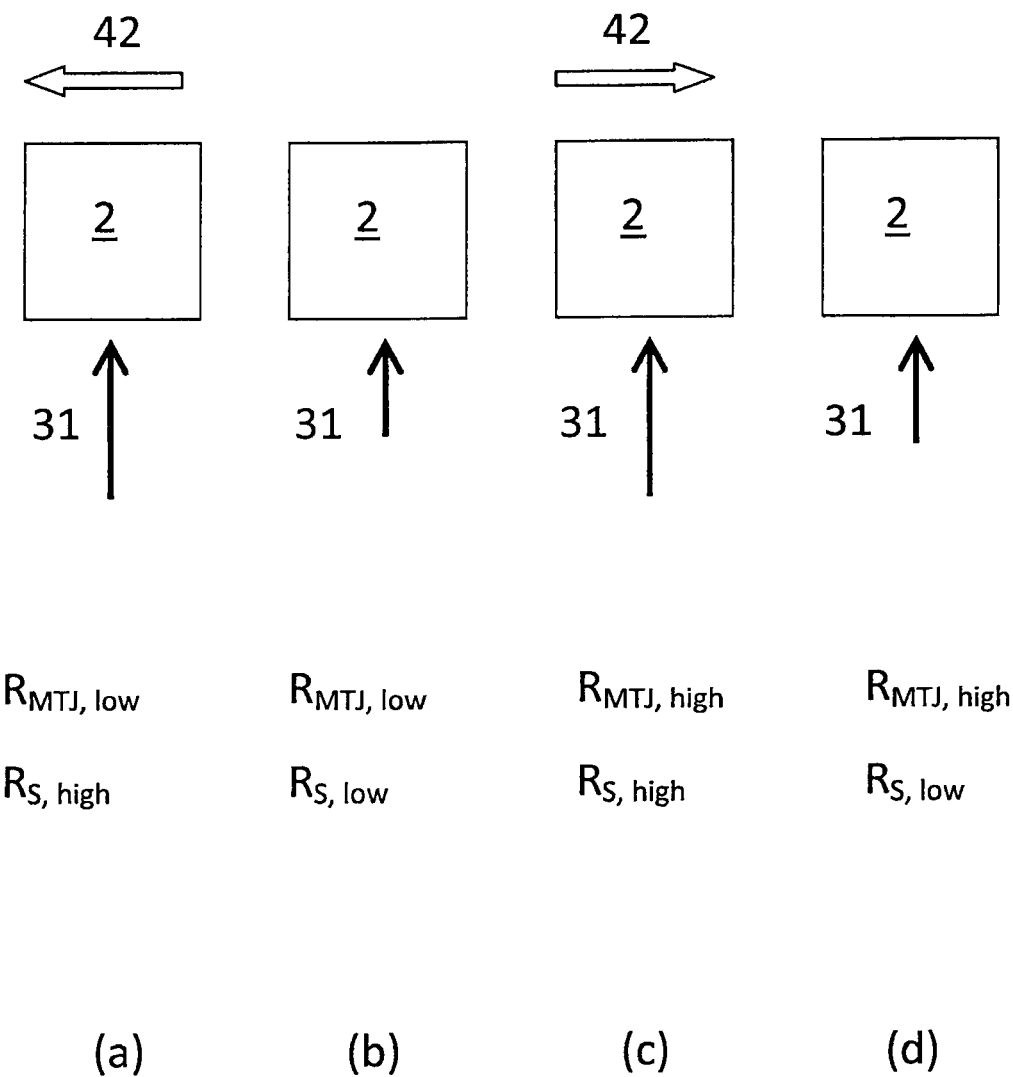
FIG. 5 represents the write operation of the MRAM cell of FIG. 3 according to another embodiment.

FIG. 5 illustrates the thermally assisted write operation of the MRAM cell 1 according to another embodiment. In this embodiment, it is assumed that the switching resistance $R_S$ is switched according to the magnitude of the switching current 31, for instance, in the case of the switching resistant element 62 having a unipolar resistance switching behavior. More particularly, it is assumed that the switching resistance $R_S$ is switched to the low switching resistance level $R_{S, low}$ when the switching current 31 is passed with the first switching magnitude, and switched to the high switching resistance level $R_{S, high}$ when the switching current 31 is passed with a second switching magnitude, higher that the first switching magnitude. It is further assumed that the first and second switching magnitudes are lower that the heating magnitude.

In step (a) of FIG. 5, the first field current 41 is passed in the first current line 4 such as to generate the first magnetic field 42 in a direction adapted to set the junction resistance $R_{MTJ}$ to the low junction resistance level $R_{MTJ, low}$ (similarly to step of FIG. 4 (a)). The switching current 31 is passed in the magnetic tunnel junction 2 at the heating magnitude, heating the magnetic tunnel junction 2 at the high temperature threshold and switching the switching resistance $R_S$ to its high switching resistance level $R_{S, high}$ (the heating magnitude being above the second switching magnitude).

In FIG. 5 (b), the first magnetic field 42 is not applied and the junction resistance $R_{MTJ}$ remains at the low junction resistance level $R_{MTJ, low}$. The switching current 31 is passed at the first switching magnitude, switching the switching resistance $R_S$ to its low switching resistance level $R_{S, low}$. In FIG. 5 (c), the first field current 41 is applied with the second polarity such that the junction resistance $R_{MTJ}$ is changed to the high junction resistance level $R_{MTJ, high}$. The switching current 31 is passed at the heating magnitude, heating the magnetic tunnel junction 2 at the high temperature threshold and switching the switching resistance $R_S$ to its high switching resistance level $R_{S, high}$.

EXAMPLE 3

Figure 6:
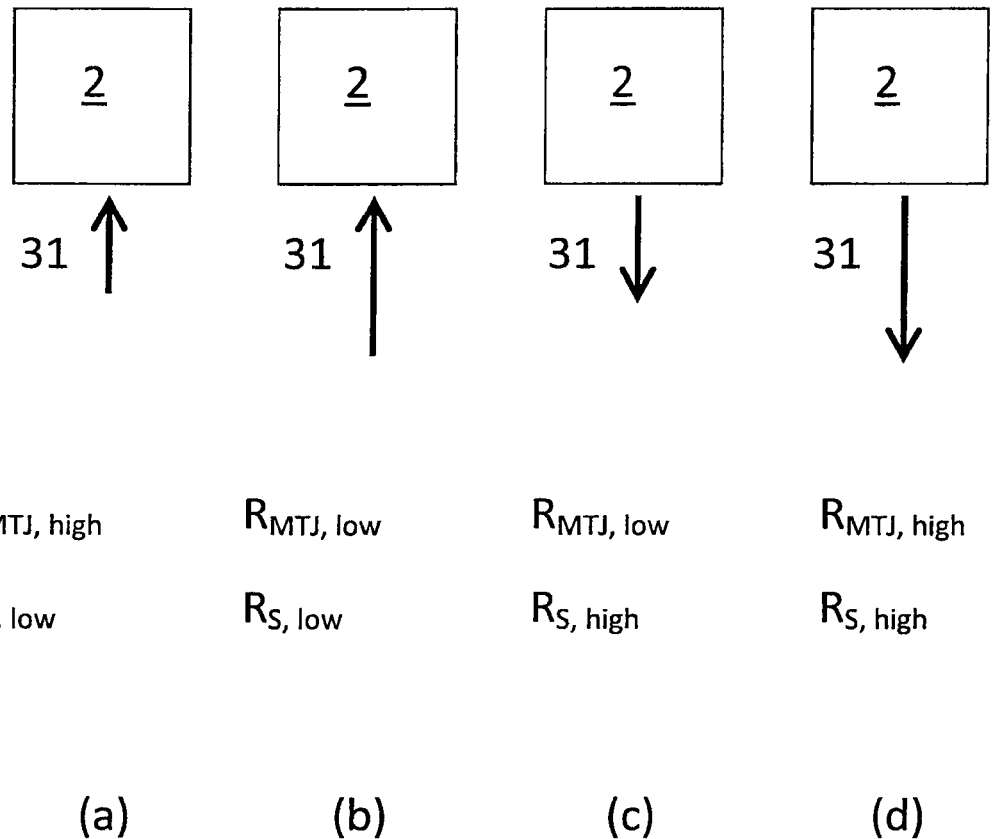
FIG. 6 illustrates the write operation of the MRAM cell of FIG. 3 according to yet another embodiment.

In yet another embodiment illustrated in FIG. 6, the thermally assisted write operation of the MRAM cell 1 comprises varying the junction resistance $R_{MTJ}$ by having the switching current 31 passed in the magnetic tunnel junction 2 being spin polarized. The spin polarized switching current 31 induces a local spin torque on the second magnetic layer 23 adjusting its magnetization direction according to the polarity of the spin polarized current. The spin polarized current must be passed at the heating magnitude such that the magnetic tunnel junction 2 is heated at the high temperature threshold. In this embodiment, it is assumed that the switching resistant element 62 has a bipolar resistance switching behavior and that the heating magnitude is lower than the first switching magnitude.

More particularly, in step illustrated in FIG. 6 (a), the switching current 31 is passed at the first switching magnitude such as to switch the switching resistance $R_S$, for example to the low switching resistance level $R_{S, low}$, in accordance with the polarity of the switching current 31. The first switching magnitude is however too low to adjust the magnetization direction of the second magnetic layer 23 and thus, varies the junction resistance $R_{MTJ}$.

In FIG. 6 (b), the magnitude of the spin polarized switching current 31 is increased to the heating magnitude such that the magnetization direction of the second magnetic layer 23 can be adjusted to, for example, the low junction resistance level $R_{MTJ, low}$, according to the polarity of the switching current 31. Since the polarity of the switching current 31 is the same as in step (a) the switching resistance level of the switching resistance $R_S$ remains unchanged. In step (c), the spin polarized switching current 31 is passed with the polarity being reversed with respect to the one in step (a) and (b), such as to switch the switching resistance $R_S$ to the high switching resistance level $R_{S, high}$. The magnitude of the switching current 31 being at the first switching magnitude, the junction resistance $R_{MTJ}$ remains at the low junction resistance level $R_{MTJ, low}$. In step (d), the magnitude of the spin polarized switching current 31 is increased to the heating magnitude so that the junction resistance $R_{MTJ}$ can be adjusted to the high junction resistance level $R_{MTJ, high}$. The switching resistance $R_S$ remains at the high switching resistance level $R_{S, high}$.

As illustrated with the three embodiments above, at least four different cell resistance levels of the MRAM cell resistance $R_C$ can be written in the MRAM cell 1 by the combination of the two resistance levels of the junction resistance $R_{MTJ}$ and the switching resistance $R_S$. This is achieved by judiciously varying the polarity of the first field current 41 and the switching current 31 and the magnitude of the switching current 31. This can also be achieved by judiciously varying the polarity and magnitude of the switching current when the write operation is performed using the spin polarized current, and the switching resistant element 62 has a bipolar resistance switching behavior. This can further be achieved by judiciously varying only the magnitude of the switching current when the write operation is performed using the spin polarized current, and the switching resistant element 62 has a unipolar resistance switching behavior. Provided the magnitude of the switching current 31 at which the switching resistance $R_S$ is switched (first and possibly second magnitude) is different than the magnitude at which the junction resistance $R_{MTJ}$ can be varies (heating magnitude).

The disclosure is susceptible to various modifications and alternative forms, and specific examples thereof have been shown by way of example in the drawings and are herein described in detail. It should be understood, however, that the disclosure is not to be limited to the particular forms or methods disclosed, but to the contrary, the disclosure is to cover all modifications, equivalents, and alternatives.

Figure 1:
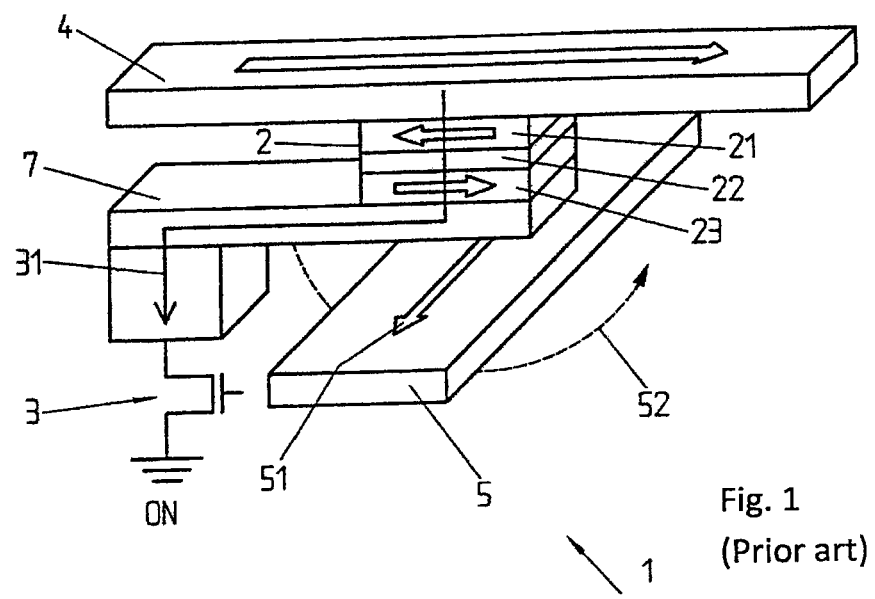
FIG. 1 shows a conventional MRAM cell.
Figure 2:
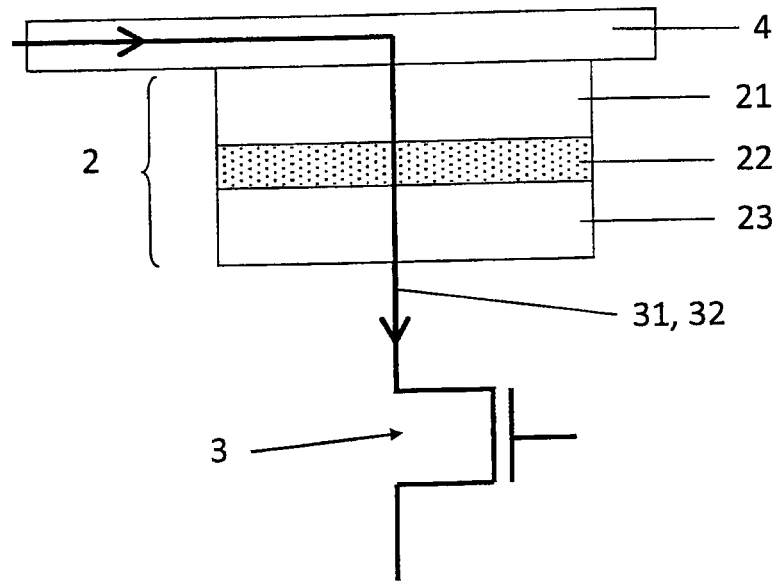
FIG. 2 illustrates the MRAM cell of FIG. 1 in another configuration.

For example, the MRAM cell 1 can comprise a second current line 5 as shown in the example of FIG. 1. A second field current 51 can then be passed in the second current line 5 generating a second magnetic field 52. The magnetization direction of the second magnetic layer 23 can then be adjusted under the combined effect of the first and second magnetic fields 42, 52. In this configuration, the magnetization of the second ferromagnetic layer 23 can be adjusted in any intermediate directions by appropriately adjusting the relative intensity, and possibly the polarity, of the first and second field currents 41, 51 along the perpendicular directions of the first and second current line 4, 5. Alternatively, adjusting the magnetization of the second ferromagnetic layer 23 in any intermediate directions can be achieved by combining the magnetic field generated in one of the lines 4, 5 with the spin polarized write current 33. This can be further combined with one of the write operations described above allowing for writing more than four cell resistance levels in the MRAM cell 1. Alternatively, the second current line 5 can be disposed above the first current line 4, for example, parallel with the latter.

The MRAM cell 1 disclosed herein achieves improved read margin compared to conventional MRAM cells since the junction resistance $R_{MTJ}$ of the magnetic tunnel junction 2 is combined with the switching resistance $R_S$ of the switching resistant element 62, 22. The cell resistance levels of the MRAM cell resistance $R_C$ are thus larger than the ones achieved in conventional multibit MRAM cells.

According to an embodiment not represented, a memory device comprises an array comprising a plurality of the MRAM cell 1 according to the embodiments. The MRAM cells 1 can be connected via one or several of the first current line 4. The memory device can further comprises one or several word lines connected to the gate of the selection transistor 3 of each of the MRAM cells 1, such as to control the selection transistor 3 enabling to address, or write, one of the MRAM cells 1 selectively.

Reference Numbers And Symbols

1 MRAM cell
2 magnetic tunnel junction
21 first ferromagnetic layer, reference layer
22 tunneling barrier layer
23 second ferromagnetic layer, storage layer
3 selection transistor
31 spin polarized write current, switching current
32 read current
4 first current line
41 first field current
42 first magnetic field
5 second current line
51 second field current
52 second magnetic field
62 switching resistant element
7 Strap
$R_C$ MRAM cell resistance
$R_S$ switching resistance
$R_{MTJ}$ junction resistance

The invention claimed is:

1. A magnetic random access memory (MRAM) cell comprising: a magnetic tunnel junction comprising a tunnel barrier layer between a first magnetic layer having a first magnetization direction, and a second magnetic layer having a second magnetization direction being adjustable from a first direction to a second direction relative to the first magnetization direction, such as to vary a junction resistance of the magnetic tunnel junction from a first to a second junction resistance level;

said magnetic tunnel junction further comprising a switching resistant element electrically connected to the magnetic tunnel junction and having a switching resistance that can be switched from a first to a second switching resistance level when a switching current is passed through the switching resistant element, such that a MRAM cell resistance of the MRAM cell can have at least four different cell resistance levels depending of the resistance level of the junction resistance and of the switching resistance.

2. Memory element according to claim 1, further comprising a first current line electrically connected to one end of the magnetic tunnel junction, and a selection transistor electrically connected to the other end of the magnetic tunnel junction; the selection transistor being selectable to pass the switching current in the current line to the magnetic tunnel junction and the switching resistant element.

3. Memory element according to claim 1, wherein the switching resistant element is in contact with the first or second magnetic layer.

4. Memory element according to claim 1, wherein said switching resistant element has a bipolar or unipolar switching resistance.

5. Memory element according to claim 1, wherein the tunnel barrier layer consists of the switching resistant element.

6. Memory cell according to claim 1, wherein the switching resistant element is made of a material selected from $Al_2O_3$, NiO, $TiO_2$, MgO, $SrTiO_3$, or a perovskite-type oxide.

7. Memory element according to claim 1, wherein the switching resistant element comprises a material selected from $Al_2O_3$, NiO, $TiO_2$, MgO, $SrTiO_3$, $Pr_{0.7}Ca_{0.3}MnO_3$ or $SrTiO_3$.

8. A memory device comprising a plurality of MRAM cells, each MRAM cell comprising a magnetic tunnel junction including a tunnel barrier layer between a first magnetic layer having a first magnetization direction and a second magnetic layer having a second magnetization, second magnetization being adjustable from a first direction to a second direction relative to the first magnetization direction such as to vary a junction resistance of the magnetic tunnel junction from a first to a second junction resistance level; said magnetic tunnel junction further comprising a switching resistant element electrically connected to the magnetic tunnel junction and having a switching resistance that can be switched from a first to a second switching resistance level when a switching current is passed through the switching resistant element, such that a resistance of the MRAM cell can have at least four different resistance levels depending of the resistance level of the junction resistance and of the switching resistance.

9. A method for writing multiple data bits in a MRAM cell comprising a magnetic tunnel junction including a tunnel barrier layer between a first magnetic layer having a first magnetization direction and a second magnetic layer having a second magnetization, second magnetization being adjustable from a first direction to a second direction relative to the first magnetization direction such as to vary a junction resistance of the magnetic tunnel junction from a first to a second junction resistance level; said magnetic tunnel junction further comprising a switching resistant element electrically connected to the magnetic tunnel junction and having a switching resistance that can be switched from a first to a second switching resistance level when a switching current is passed through the switching resistant element; the method comprising:

heating the magnetic tunnel junction to a high temperature threshold;

once the magnetic tunnel junction has reached the high temperature threshold, adjusting the second magnetization direction of the second magnetic layer to vary the junction resistance from the first junction resistance level to the second junction resistance level; and switching the switching resistance from the first switching resistance level to the second switching resistance level by passing the switching current through the switching resistant element, such that a resistance of the MRAM cell can have at least four different resistance levels depending of the resistance level of the junction resistance and of the switching resistance.

10. Method according to claim 9, wherein said heating the magnetic tunnel junction at a high temperature threshold comprises passing the switching current with a heating magnitude in the magnetic tunnel junction.

11. Method according to claim 9, wherein said switching resistant element has a bipolar switching resistance, and wherein said switching the switching resistance comprises reversing the polarity of the switching current.

12. Method according to claim 9, wherein said switching resistant element has a unipolar switching resistance, and wherein said switching the switching resistance comprises passing the switching current having a first switching magnitude for switching the switching resistance to the first switching resistance level, and passing the switching current having a second switching magnitude for switching the switching resistance to the second switching resistance level, the second switching magnitude being higher that the first switching magnitude and lower than the heating magnitude.

13. Method according to claim 9, wherein said adjusting the second magnetization direction comprises applying a first magnetic field, the second magnetization direction of the second magnetic layer being adjusted according to the first magnetic field.

14. Method according to claim 9, wherein said adjusting the second magnetization direction of the second magnetic layer comprises passing the switching current in the magnetic tunnel junction, the switching current being spin polarized.

15. A method for writing multiple data bits in a MRAM cell comprising a magnetic tunnel junction including a tunnel barrier layer between a first magnetic layer having a first magnetization direction and a second magnetic layer having a second magnetization, second magnetization being adjustable from a first direction to a second direction relative to the first magnetization direction such as to vary a junction resistance of the magnetic tunnel junction from a first to a second junction resistance level; said magnetic tunnel junction further comprising a switching resistant element electrically connected to the magnetic tunnel junction and having a switching resistance that can be switched from a first to a second switching resistance level when a switching current is passed through the switching resistant element; the method comprising:

heating the magnetic tunnel junction to a high temperature threshold;

once the magnetic tunnel junction has reached the high temperature threshold, adjusting the second magnetization direction of the second magnetic layer to vary the junction resistance from the first junction resistance level to the second junction resistance level; and switching the switching resistance from the first switching resistance level to the second switching resistance level by passing the switching current through the switching resistant element, such that a resistance of the MRAM cell can have at least four different resistance levels depending of the resistance level of the junction resistance and of the switching resistance, wherein said switching resistant element has a unipolar switching resistance, and wherein said switching the switching resistance comprises passing the switching current having a first switching magnitude for switching the switching resistance to the first switching resistance level, and passing the switching current having a second switching magnitude for switching the switching resistance to the second switching resistance level, the second switching magnitude being higher that the first switching magnitude and lower than the heating magnitude.

* * * * *

UNITED STATES PATENT AND TRADEMARK OFFICE
CERTIFICATE OF CORRECTION

| | | |
|---|---|---|
| PATENT NO. | : 8,659,938 B2 | Page 1 of 1 |
| APPLICATION NO. | : 13/326439 | |
| DATED | : February 25, 2014 | |
| INVENTOR(S) | : Ioan Lucian Prejbeanu | |

It is certified that error appears in the above-identified patent and that said Letters Patent is hereby corrected as shown below:

On the Title page, under (30) Foreign Application Priority Data, please replace "Dec. 16, 1920" with - Dec. 16, 2010 -

Signed and Sealed this
Fourteenth Day of October, 2014

Michelle K. Lee
*Deputy Director of the United States Patent and Trademark Office*